US012656825B2

(12) United States Patent
Park et al.

(10) Patent No.: US 12,656,825 B2
(45) Date of Patent: *Jun. 16, 2026

(54) FLEXIBLE DISPLAY DEVICE

(71) Applicant: LG Display Co., Ltd., Seoul (KR)

(72) Inventors: Youngjoo Park, Busan (KR); Sejin Jang, Paju-si (KR); Taehyoung Kwak, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 457 days.

This patent is subject to a terminal disclaimer.

(21) Appl. No.: 17/942,877

(22) Filed: Sep. 12, 2022

(65) Prior Publication Data

US 2023/0006179 A1     Jan. 5, 2023

Related U.S. Application Data

(63) Continuation of application No. 16/933,657, filed on Jul. 20, 2020, now Pat. No. 11,476,444.

(30) Foreign Application Priority Data

Jul. 26, 2019     (KR) ........................ 10-2019-0091241

(51) Int. Cl.
| | |
|---|---|
| *G06F 1/16* | (2006.01) |
| *H10K 59/126* | (2023.01) |
| *H10K 59/80* | (2023.01) |
| *H10K 59/12* | (2023.01) |
| *H10K 102/00* | (2023.01) |

(52) U.S. Cl.
CPC ......... *G06F 1/1652* (2013.01); *H10K 59/126* (2023.02); *H10K 59/871* (2023.02); *H10K*

*59/12* (2023.02); *H10K 59/8722* (2023.02); *H10K 2102/311* (2023.02)

(58) Field of Classification Search
CPC . G06F 1/1652; G06F 1/1656; H10K 50/8426; H10K 50/844; H10K 50/842; H10K 59/126; H10K 59/871; H10K 59/12; H10K 59/8722; H10K 2102/311; C09D 133/04; C09D 163/00; C09D 175/14; C09D 183/04; G09F 9/33; G09F 9/335; G09F 9/301; Y10T 428/24628; Y10T 428/24942; Y10T 428/2495; Y10T 428/24967
USPC .................................. 428/174, 212, 213, 215
See application file for complete search history.

(56) References Cited

U.S. PATENT DOCUMENTS

| | | | |
|---|---|---|---|
| 10,793,747 | B2 | 10/2020 | Park et al. |
| 10,809,421 | B2 | 10/2020 | Song et al. |
| 11,097,521 | B2 | 8/2021 | Choi et al. |
| | | (Continued) | |

FOREIGN PATENT DOCUMENTS

| | | |
|---|---|---|
| CN | 107003789 A | 8/2017 |
| CN | 107797165 A | 3/2018 |
| | (Continued) | |

*Primary Examiner* — Megha M Gaitonde
(74) *Attorney, Agent, or Firm* — Seed Intellectual Property Law Group LLP

(57) ABSTRACT

A flexible display device includes a flexible display panel. The flexible display device further includes a cover window structure on the flexible display panel, including a flexible film and a first hard coating layer on the flexible film. The first hard coating layer includes a material made of a combination of a siloxane resin and a urethane-acrylic-, acrylic- or epoxy-type linker.

21 Claims, 4 Drawing Sheets

100

(56)     References Cited

U.S. PATENT DOCUMENTS

| | | | |
|---|---|---|---|
| 12,041,806 B2 * | 7/2024 | Park | H10K 50/841 |
| 2017/0156227 A1 | 6/2017 | Heo et al. | |
| 2017/0179424 A1 * | 6/2017 | Lee | H10K 77/111 |
| 2018/0066152 A1 | 3/2018 | Lee et al. | |
| 2019/0009505 A1 | 1/2019 | Song et al. | |
| 2019/0143638 A1 * | 5/2019 | Park | B32B 7/022 |
| | | | 361/820 |

FOREIGN PATENT DOCUMENTS

| | | | | |
|---|---|---|---|---|
| CN | 107976724 A | 5/2018 | | |
| EP | 3299162 A1 * | 3/2018 | | B32B 27/06 |
| KR | 20170064103 A | 6/2017 | | |
| KR | 20180058912 A | 6/2018 | | |
| KR | 101965682 B1 | 4/2019 | | |
| KR | 20190056474 A | 5/2019 | | |
| WO | WO 2019240408 A1 | 12/2019 | | |

* cited by examiner

100

PXL

AA

NA

I ←———————————————————————→ I'

FLEXIBLE DISPLAY DEVICE

CROSS-REFERENCE TO RELATED APPLICATIONS

This application claims priority to Korean Patent Application No. 10-2019-0091241 filed in the Korean Intellectual Property Office on Jul. 26, 2019, the disclosure of which is incorporated herein by reference in its entirety as if fully set forth herein.

BACKGROUND

Technical Field

The present disclosure relates to a flexible display device, and more particularly, to a flexible display device having improved surface hardness, flexibility, and dent recovery ability.

Description of the Related Art

Display devices employed by the monitor of a computer, a TV, a mobile phone or the like include an electroluminescence display device that emits light by itself, and a liquid-crystal display (LCD) that requires a separate light source.

Example of electroluminescence display devices may include an organic light-emitting diode display (OLED) device, an inorganic light-emitting diode display device, a micro LED display device, a mini LED display device, etc.

Such display devices find more and more applications, including computer monitors and televisions, as well as personal portable devices. Accordingly, research is ongoing to develop display devices having a larger display area with reduced volume and weight.

Recently, flexible display devices are attracting attention as next-generation display devices, which can be folded and unfolded as desired by forming the display area, wirings, etc., on a flexible substrate.

BRIEF SUMMARY

The degree of flexibility of a flexible display device may be defined as a threshold curvature radius (RTH). The threshold curvature radius refers to the minimum radius that allows a flexible display device to be bent without being broken. The smaller the threshold curvature radius of a material is, the greater the flexibility of the material is. On the contrary, as the threshold curvature radius increases, the flexibility of the flexible display device decreases. The threshold curvature radius of a flexible display device may be determined as a factory default or based on a third party's experiment results.

The inventors of the application have recognized that flexible display devices require excellent surface hardness, excellent flexibility, and excellent dent recovery ability to be commercially competitive. For mass production of flexible display devices designed to be bent, curled, or fold, the above-described characteristics are essentially required. Accordingly, the inventors of the application have researched and developed a flexible display device capable having improved surface hardness, flexibility, and dent recovery ability.

The inventors of the application have studied the organic coupling relationship between a cover window structure and a flexible display panel of a flexible display device to improve surface hardness, flexibility, and dent recovery ability. The cover window structure may refer to an element configured to protect the display surface of the flexible display device. The flexible display panel may refer to a flexible panel in which a plurality of pixels including light-emitting elements are formed.

Firstly, the inventors of the application have studied to improve anti-scratch properties of the flexible display device by improving the surface hardness of the cover window structure.

The inventors of the application have conducted various studies to improve the anti-scratch properties of the flexible display device using a high-hardness coating material capable of improving the surface hardness of the cover window structure.

However, due to the brittle characteristics of the high-hardness coating material, the threshold curvature radius of a flexible display device may be increased. If the threshold curvature radius increases, the flexibility decreases, and thus applications of the flexible display device may be limited.

In other words, the inventors of the application have recognized that as the thickness of the high-hardness coating material of the cover window structure increases, the flexibility of the flexible display device may be decreased.

In view of the above, the inventors of the application have studied on a flexible display device that has improved surface hardness as well as flexibility.

As described above, when the high-hardness coating material is thick, the high-hardness coating material of the cover window structure may be broken when the display device is bent. Accordingly, the inventors of the application have studied the correlation between the thickness of the high-hardness coating material and the threshold curvature radius, and have found the fact that the surface hardness of the cover window structure may not be substantially decreased even if the thickness of the high-hardness coating material is reduced. More specifically, as a result of attempts to reduce the thickness, the inventors of the application have found that the cover window structure can improve the surface hardness of the flexible display device as well as the flexibility.

Unfortunately, the inventors of the application have recognized that the above-described flexible display device having the thin cover window structure has a problem that the flex display device may be vulnerable to scratches. Specifically, permanent deformations such as dent and impression may be made on the flexible display device by a sharp object such as a pen and a nail. In addition, the inventors of the application have recognized that there may be problems such as defective pixels, disconnection of signal wiring in the flexible display panel.

Accordingly, the inventors of the application have studied to improve the surface hardness of a flexible display device, improve the flexibility of the flexible display device, and also improve the dent recovery ability of the flexible display device.

To improve the dent issue on flexible display devices, the inventors of the application have recognized that it is necessary to improve the dent recovery ability of the flexible display device.

More specifically, as the dent recovery ability of a flexible display device is decreased, a dent may remain permanently. If an external force is applied to the thin cover window structure and depresses it, then the impact is transmitted to the flexible display panel. As a result, the flexible display panel may be deformed.

The inventors of the application have found that the dent recovery ability of a flexible display device may vary depending on the materials of the cover window structure and the flexible display panel and the stacked structure.

Moreover, unlike the scratches, the dent issue cannot be solved by simply improving the surface hardness of the cover window structure.

That is to say, a dent defect may occur permanently even if no scratch is made on the surface of the flexible display device.

In view of the above, what is required is a flexible display device having excellent surface hardness, excellent flexibility, and excellent dent recovery ability.

Objects of the present disclosure are not limited to the above-mentioned objects, and other objects, which are not mentioned above, can be clearly understood by those skilled in the art from the following descriptions.

According to an aspect of the present disclosure, there is provided a flexible display device. The flexible display device includes a flexible display panel. The flexible display device further includes a cover window structure on the flexible display panel, and including a flexible film and a first hard coating layer on the flexible film. The first hard coating layer includes a material made of a combination of a siloxane resin and a urethane-acrylic-, acrylic- or epoxy-type linker.

A thickness of the first hard coating layer may be 30 μm to 80 μm, and the first hard coating layer may have a pencil scratch hardness of 4H or more when measured at a test with a vertical load weight of 750 g according to ASTM D3363.

A thickness of the first hard coating layer may be equal to or greater than a thickness of the flexible film.

A thickness of the flexible film may be 30 μm to 80 μm.

The cover window structure may further include a second hard coating layer on a back side of the flexible film.

The second hard coating layer may be made of a same material as the first hard coating layer.

The second hard coating layer may be made of a different material from the first hard coating layer.

A thickness of the first hard coating layer may be equal to a thickness of the second hard coating layer.

A thickness of the first hard coating layer may be different from a thickness of the second hard coating layer.

The flexible display device may further include an adhesive member between the cover window structure and the flexible display panel, a modulus of elasticity the adhesive member may be $10^3$ Pa to $10^6$ Pa.

A thickness of the cover window structure may be 150 μm to 240 μm.

Other detailed matters of the exemplary embodiments are included in the detailed description and the drawings.

According to exemplary embodiments of the present disclosure, a flexible display device can have excellent surface hardness, excellent flexibility, and excellent dent recovery ability.

The effects according to the present disclosure are not limited to the contents exemplified above, and more various effects are included in the present specification.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
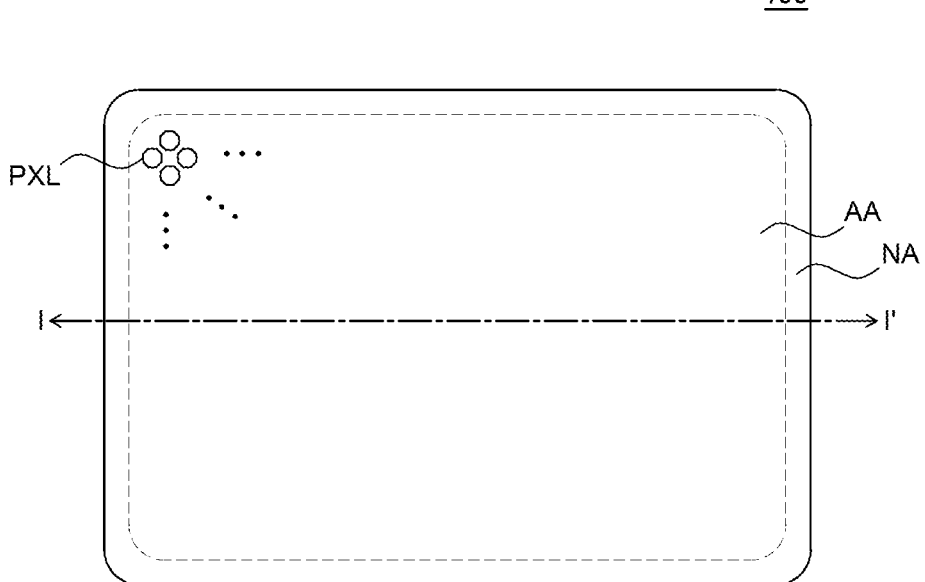
FIG. 1 is a plan view of a flexible display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. There-fore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, the element or layer may be directly disposed on the another element or layer, or other element or layer may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a plan view of a flexible display device according to an exemplary embodiment of the present disclosure.

Figure 2:
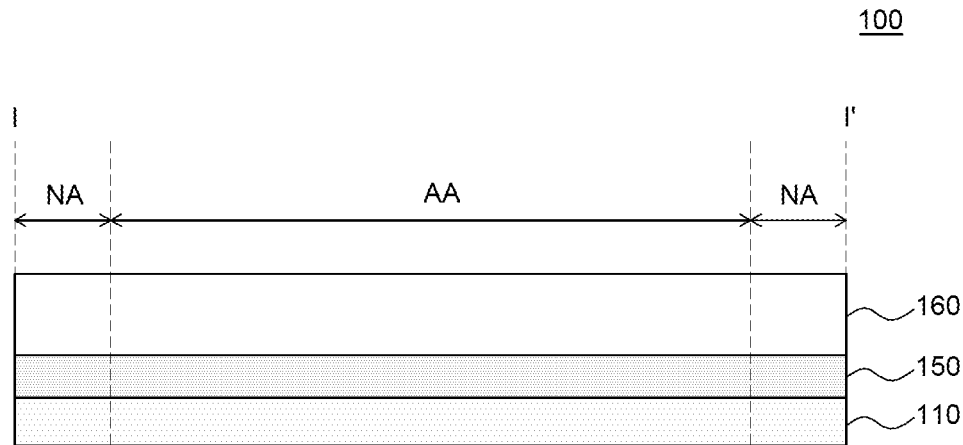
FIG. 2 is a schematic cross-sectional view, taken along line I-I' of FIG. 1.

FIG. 2 is a cross-sectional view taken along line I-I' of FIG. 1.

Hereinafter, a flexible display device 100 according to an exemplary embodiment of the present disclosure will be described with reference to FIGS. 1 and 2.

Referring to FIG. 1, the flexible display device 100 may be divided into a display area AA and a non-display area NA.

In the display area AA, images are displayed, and a plurality of pixels PXL for displaying images may be disposed.

Each of the pixels PXL disposed in the display area AA may include a display element and a thin-film transistor for driving the display element.

For example, when the flexible display device 100 is an organic light-emitting diode display device, the display element of each of the pixels PXL may include an organic light-emitting diode. It is, however, to be understood that the present disclosure is not limited thereto. The display element may be implemented as an inorganic light-emitting display device, a quantum-dot light-emitting display device, a micro LED display device, or a mini LED display device, etc. In the following description, the display element includes an organic light-emitting diode, for example. It is, however, to be understood that the present disclosure is not limited thereto.

In the non-display area NA which does not display images, circuitry, wiring and elements for driving the display elements in the display area AA are disposed. A variety of driving circuits such as a gate driver and a data driver may be disposed in the non-display area NA. For example, the driving circuits may be implemented in the non-display area NA by GIP (Gate In Panel) technique, by TCP (Tape Carrier Package) technique, by COF (Chip On Film) technique, or the like. The non-display area NA may surround the display area AA, as shown in FIG. 1. It is, however, to be understood that the present disclosure is not limited thereto. The non-display area NA may be defined as a peripheral area of the display area AA, or may be defined as an area where no pixel is disposed. Since no pixel is disposed in the non-display area NA, the non-display area NA may further include a black matrix that substantially blocks visible light from the non-display area or a decoration film. It is, however, to be understood that the present disclosure is not limited thereto.

Referring back to FIG. 2, the flexible display device 100 according to an exemplary embodiment of the present disclosure may include at least a flexible display panel 110, an adhesive member 150, and a cover window structure 160. The adhesive member 150 may be disposed on the flexible display panel 110 to fix the cover window structure 160 to the flexible display panel 110.

In the flexible display device 100 according to the exemplary embodiment of the present disclosure, the flexible display panel 110, the adhesive member 150 and the cover window structure 160 are organically combined taking into account the surface hardness, flexibility and dent recovery ability.

Figure 3:
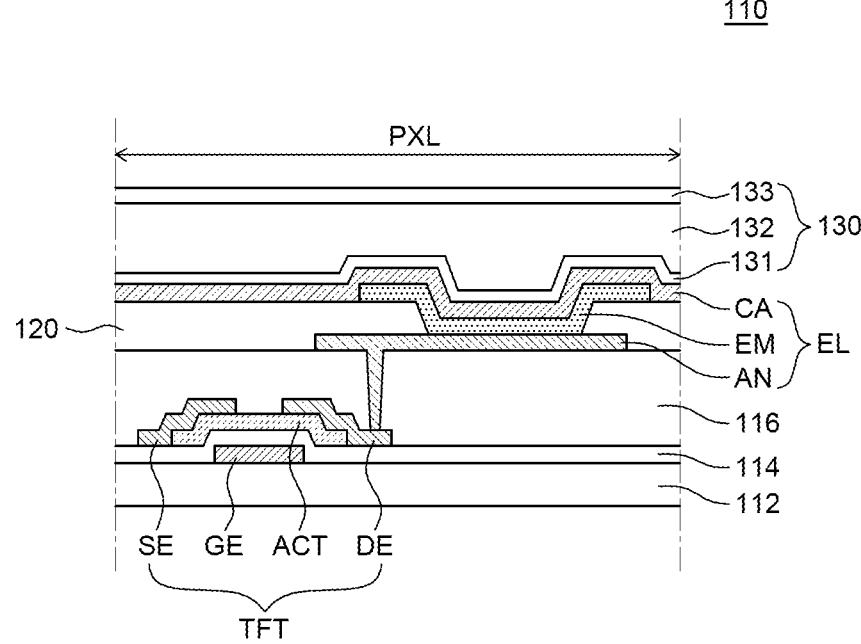
FIG. 3 is a cross-sectional view showing a flexible display panel of a flexible display device according to an exemplary embodiment of the present disclosure.

FIG. 3 is a cross-sectional view showing a flexible display panel of a flexible display device according to an exemplary embodiment of the present disclosure.

Hereinafter, the flexible display panel 110 will be described in more detail with reference to FIGS. 1 to 3.

According to an exemplary embodiment of the present disclosure, a plurality of pixels PXL is disposed in the display area AA of the flexible display panel 110. Each of the pixels PXL may include a light-emitting element EL and a transistor TFT.

The flexible display panel 110 may include a flexible substrate 112, a transistor TFT, a gate insulating layer 114, a planarization layer 116, a light-emitting element EL, and an encapsulation unit 130.

The flexible substrate 112 is a base member for supporting elements included in the flexible display panel 110 and may be made of an insulating material. The flexible substrate 112 may be made of a material having flexibility, e.g., a plastic material such as polyimide.

The transistor TFT is disposed on the flexible substrate 112. The transistor TFT may include a gate electrode GE, an active layer ACT, a source electrode SE, and a drain electrode DE. Although a bottom-gate transistor TFT in which the gate electrode GE of the transistor TFT is disposed under the active layer ACT is shown in FIG. 3, the present disclosure is not limited thereto.

The gate electrode GE of the transistor TFT is disposed on the flexible substrate 112. The gate electrode GE may be made of, but is not limited to, a conductive material, e.g., copper (Cu), aluminum (Al), molybdenum (Mo), titanium (Ti), or an alloy thereof.

The gate insulating layer 114 is disposed on the gate electrode GE. The gate insulating layer 114 is a layer for insulating the gate electrode GE from the active layer ACT, and may be made of an insulating material. For example, the gate insulating layer 114 may be made up of, but is not limited to, a single layer or a plurality of layers of silicon oxide (SiOx) or silicon nitride (SiNx).

The active layer ACT is disposed on the gate insulating layer 114. The active layer ACT may be made of an oxide semiconductor, an organic semiconductor, amorphous silicon or polysilicon.

The source electrode SE and the drain electrode DE, which are spaced apart from each other, are disposed on the active layer ACT. The source electrode SE and the drain electrode DE may be electrically connected to the active layer ACT. The source electrode SE and the drain electrode DE may be made of, but is not limited to, a conductive material, e.g., copper (Cu), aluminum (Al), molybdenum (Mo), titanium (Ti), or an alloy thereof.

Although not shown in the drawings, a buffer layer may be disposed between the flexible substrate 112 and the transistor TFT. The buffer layer can prevent permeation of moisture or impurities through the flexible substrate 112. It is, however, to be noted that the buffer layer is not an essential element, and may be optionally disposed depending on the type of the flexible substrate 112 or the type of the transistor TFT.

The planarization layer 116 provides a flat surface over the transistor TFT. The planarization layer 116 may be made up of a single layer or multiple layers and may be made of organic material. For example, the planarization layer 116 may be made of, but is not limited to, an acryl based organic material. The planarization layer 116 includes a contact hole for electrically connecting the transistor TFT with the light-emitting element EL.

The light-emitting element EL is disposed on the planarization layer 116. The light-emitting element EL is a self-luminous element that emits light on its own and may be driven by the transistor TFT disposed in each of the pixels PXL. The light-emitting element EL may include an anode AN, an emission layer EM, and a cathode CA.

The anode AN is separately disposed for each of the pixels PXL on the planarization layer 116. The anode AN may be electrically connected to the drain electrode DE of the transistor TFT through the contact hole formed in the planarization layer 116. The anode AN is made of a conductive material capable of supplying holes to the emission layer EM. For example, the anode may be formed as a reflective layer made of, but is not limited to, a transparent conductive material such as tin oxide (TO), indium tin oxide (ITO), indium zinc oxide (IZO) and indium tin zinc oxide (ITZO), and a material having excellent reflectivity such as silver (Ag) and silver alloy (Ag alloy). Although FIG. 3 shows that the anode AN is electrically connected to the drain electrode DE of the transistor TFT, the anode AN may be electrically connected to the source electrode SE of the transistor TFT depending on the type of the transistor TFT.

A bank 120 is disposed on the anode AN and the planarization layer 116. The bank 120 is an insulating layer for separating between emission zones of pixels PXL adjacent to each other. The bank 120 may be disposed to open a part of the anode AN. The bank 120 may be made of an organic insulating material disposed to cover the edge of the anode AN.

The emission layer EM is disposed on the anode AN. The emission layer EM may be made up of a single emissive layer or a stack of multiple layers that emit light of different colors. The emission layer EM may further include a hole injecting layer, a hole transporting layer, an electron transporting layer, and an electron injecting layer. Although FIG. 3 shows that the emission layer EM disposed in each of the pixels PXL is separated from that disposed in another pixel, all or some of the emission layer EM may be formed as a single layer across the plurality of pixels PXL.

The cathode CA is disposed on the emission layer EM. The cathode CA is made of a conductive material that can supply electrons to the emission layer EM. For example, the cathode CA may be made of, but is not limited to, a transparent conductive oxide such as indium tin oxide (ITO), indium zinc oxide (IZO), indium tin zinc oxide (ITZO), zinc oxide (ZnO) and tin oxide (TO), or magnesium (Mg), silver-magnesium (Ag:Mg), ytterbium (Yb) alloy, ytterbium oxide (YbO), etc. Although FIG. 3 shows that the cathode CA is disposed in a pixel PXL is connected to that disposed in another pixel PXL, the cathode CA may also be disposed separately in each of the pixels PXL, like the anode AN.

The encapsulation unit 130 is disposed on the light-emitting element EL. The encapsulation unit 130 is a sealing member that protects the light-emitting element EL from external moisture, air, impact, etc. The encapsulation unit 130 may be formed by stacking a first inorganic layer 131, an organic layer 132, and a second inorganic layer 133. For example, the first inorganic layer 131 or the second inorganic layer 133 may be made of an inorganic material such as silicon nitride (SiNx), silicon oxide (SiOx), silicon oxide nitride (SiOxNx) and aluminum oxide (AlOx). The organic layer 132 may be made of, but is not limited to, an epoxy-based or acryl-based polymer.

Figure 4:
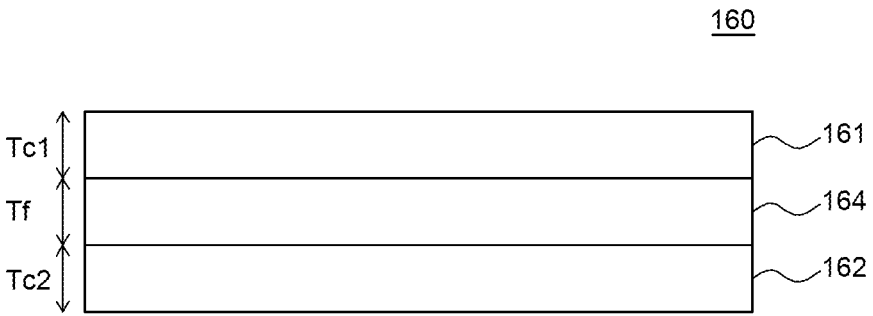
FIG. 4 is a cross-sectional view schematically showing a cover window structure of a flexible display device according to an exemplary embodiment of the present disclosure.

FIG. 4 is a cross-sectional view schematically showing a cover window structure of a flexible display device according to an exemplary embodiment of the present disclosure.

The cover window structure 160 according to an exemplary embodiment of the present disclosure may include a first hard coating layer 161, a second hard coating layer 162, and a flexible film 164.

The first hard coating layer 161 is formed on the flexible film 164. The first hard coating layer 161 is formed on the flexible film 164 to protect the flexible display device 100 from scratches.

Specifically, the first hard coating layer 161 may include a combination of siloxane resin as a base material and an urethane-acrylic-type linker, an acrylic-type linker, or an epoxy-type linker as a linker.

The inventors of the application have recognized that a hard coating material made of the combination of the siloxane resin and the urethane-acrylic-, acrylic- or epoxy-type linker can provide excellent surface hardness while significantly reducing brittle characteristics.

The first hard coating layer 161 may be formed by combining the linker such as urethane-acrylic-, acrylic- or epoxy-type linger with the backbone of the siloxane resin, and then coating it onto the flexible film 164. The first hard coating layer 161 may be formed via a curing process. For example, the first hard coating layer 161 may be cured via a thermal curing, photo curing, or chemical curing process. The first hard coating layer 161 may further include an initiator or additive that causes an optical or chemical reaction.

Hereinafter, the scratch characteristics of the flexible display device 100 will be described.

According to the exemplary embodiment of the present disclosure, the first hard coating layer 161 including the material made of the combination of the siloxane resin and an urethane-acrylic-, an acrylic-, or an epoxy-type linker has a predetermined surface hardness.

The surface hardness of the flexible display device 100 may be measured based on a variety of test standards. For example, the surface hardness of the flexible display device 100 may be measured by using the pencil scratch hardness with a certain vertical load weight according to ASTM D3363, which is one of international standards. The vertical load weight may be, for example, 1 Kg, 750 g, 500 g, or 250 g. It is, however, to be understood that the present disclosure is not limited thereto. More specifically, the pencil scratch hardness may scale 9H, 8H, 7H, 6H, 5H, 4H, 3H, 2H, H, F, B, 2B, 3B, 4B, 5B, 6B, 7B, 8B, and 9B. The 9H indicates the highest hardness while 9B indicates the lowest hardness.

According to the exemplary embodiment of the present disclosure, the first hard coating layer 161 including the material made of combination of the siloxane resin and the urethane-acrylic-, the acrylic-, or the epoxy-type linker has a first thickness Tc1. It is to be noted that the pencil scratch hardness and the first thickness Tc1 of the first hard coating layer 161 may not have any substantial correlation with each other. Therefore, the pencil scratch hardness of the first hard coating layer 161 may be maintained substantially the same regardless of the first thickness Tc1.

The pencil scratch hardness of the first hard coating layer 161 including the material made of the combination of the siloxane resin and the urethane-acrylic-, the acrylic-, or the epoxy-type linker may be 4H at the test with the vertical load weight of 750 g. The pencil scratch hardness of the first hard coating layer 161 may be 6H at the test with the vertical load weight of 500 g. The pencil scratch hardness of the first hard coating layer 161 may be 8H at the test with the vertical load weight of 250 g.

More specifically, if the pencil scratch hardness of the first hard coating layer 161 at the test with the vertical load weight of 750 g is 4H or higher, the pencil hardness is appropriate for commercial use. Accordingly, the flexible display device 100 including the first hard coating layer 161 including the material made of the combination of the siloxane resin and the urethane-acrylic-, the acrylic-, or the epoxy-type linker can exhibit excellent anti-scratch properties.

Hereinafter, the dent recovery ability of the flexible display device 100 will be described.

The first thickness Tc1 of the first hard coating layer 161 including the material made of the combination of the siloxane resin and the urethane-acrylic-, the acrylic-, or the epoxy-type linker may be 30 μm to 80 μm. Preferably, the first thickness Tc1 of the first hard coating layer 161 including the material made of the combination of the siloxane resin and the urethane-acrylic-, the acrylic-, or the epoxy-type linker may be 35 μm to 75 μm. More preferably, the first thickness Tc1 of the first hard coating layer 161 including the material made of the combination of the siloxane resin and the urethane-acrylic-, the acrylic-, or the epoxy-type linker may be 40 μm to 70 μm. Most preferably, the first thickness Tc1 of the first hard coating layer 161 including the material made of the combination of the siloxane resin and the urethane-acrylic-, the acrylic-, or the epoxy type linker may be equal to 60 μm.

If the first thickness Tc1 of the first hard coating layer 161 is less than 30 μm, the dent recovery ability of the flexible display device 100 may be significantly deteriorated. If the first thickness Tc1 of the first hard coating layer 161 is more than 80 μm, the flexibility of the flexible display device 100 may be significantly deteriorated, such that cracks may occur in the first hard coating layer 161 when it is bent.

The flexible display device 100 may be bent with, for example, a radius of curvature of 4 mm (4R), which is suitable for a foldable display or the like.

If the first thickness Tc1 of the first hard coating layer 161 is 30 μm to 80 μm, good dent recovery ability can be achieved. For example, if the first thickness Tc1 is 30 μm to 80 μm, the threshold curvature radius of the flexible display device 100 can be 4 mm (4R) or less. Accordingly, the display device is bent with a radius larger than the threshold curvature radius, such that crack does not occur in the first hard coating layer 161. In addition, the pencil scratch hardness of the flexible display device 100 can be 4H or more at the test with the vertical load weight of 750 g, and the dent recovery ability also can be improved.

That is to say, when the first hard coating layer made of the hard coating material made of the combination of the siloxane resin and the urethane-acrylic-, the acrylic-, or the epoxy-type linker has the first thickness Tc1 from 30 μm to 80 μm, the brittle characteristics can be significantly reduced when the cover window structure 160 is bent, the excellent surface hardness can be achieved, and the dent recovery ability can be improved.

Since the second hard coating layer 162 according to the embodiment of the present disclosure is formed on the back surface of the flexible film 164, a sharp object such as a pen and pencil does not come into contact with the second hard coating layer 162. Therefore, the second hard coating layer 162 is designed primarily taking the dent recovery ability of the flexible display device 100 into account.

According to the exemplary embodiment of the present disclosure, the second hard coating layer 162 including the material made of the combination of the siloxane resin and an urethane-acrylic-, an acrylic-, or an epoxy-type linker has a second thickness Tc2.

The second hard coating layer 162 is formed by combining the siloxane resin with the urethane-acrylic-, acrylic-, or epoxy-type linker and then applying it to the back surface of the flexible film 164. The second hard coating layer 162 may be formed via a curing process.

The second thickness Tc2 of the second hard coating layer 162 including the material made of the combination of the siloxane resin and the urethane-acrylic-, the acrylic-, or the epoxy-type linker may be 30 μm to 80 μm. Preferably, the second thickness Tc2 of the second hard coating layer 162 including the material made of the combination of the siloxane resin and the urethane-acrylic-, the acrylic-, or the epoxy-type linker may be 35 μm to 75 μm. More preferably, the second thickness Tc2 of the second hard coating layer 162 including the material made of the combination of the siloxane resin and the urethane-acrylic-, the acrylic-, or the epoxy-type linker may be 40 μm to 70 μm. Most preferably, the second thickness Tc2 of the second hard coating layer 162 including the material made of the combination of the siloxane resin and the urethane-acrylic-, the acrylic-, or the epoxy-type linker may be equal to 60 μm.

If the second thickness Tc2 of the second hard coating layer 162 is less than 30 μm, the dent recovery ability of the flexible display device 100 may be significantly deteriorated. If the second thickness Tc2 of the second hard coating layer 162 is more than 80 μm, the flexibility of the flexible display device 100 may be significantly deteriorated, such that cracks may occur in the second hard coating layer 162 when it is bent.

According to the above-described configuration, the second hard coating layer 162 may be formed on the back surface of the flexible film 164, and thus it is possible to suppress the deformation of the first hard coating layer 161 and the flexible film 164 by external force. Therefore, the second hard coating layer 162 can improve the dent recovery ability of the cover window structure 160, and accordingly the dent recovery ability of the flexible display device 100 according to an exemplary embodiment of the present disclosure can be improved.

That is to say, the second hard coating layer 162 may be configured to provide excellent dent recovery ability. If the second thickness Tc2 of the second hard coating layer 162 is 30 μm to 80 μm, good dent recovery ability can be achieved. For example, if the second thickness Tc2 is 30 μm to 80 μm, the threshold curvature radius of the flexible display device 100 can be 4 mm (4R) or less. Accordingly, the display device is bent with a radius larger than the threshold curvature radius, such that crack does not occur in the second hard coating layer 162.

The thickness of the first hard coating layer 161 is substantially equal to the thickness of the second hard coating layer 162. When the thickness of the first hard coating layer 161 is equal to the thickness of the second hard coating layer 162, there is an effect that it is possible to suppress the cover window structure 160 from being curled.

The thickness of the first hard coating layer 161 may be different from the thickness of the second hard coating layer 162. If one of the first hard coating layer 161 and the second hard coating layer 162 has a larger thickness than the other one, there is an effect that the dent recovery ability can be further improved.

The flexible film 164 is configured to support the first hard coating layer 161 and the second hard coating layer 162. The flexible film 164 is configured to provide excellent flexibility. The flexible film 164 may be made of at least one material of transparent polyimide, tri acetate cellulose (TAC), acryl, polyethylene terephthalate (PET), polycarbonate (PC), and polyethylene naphthalate (PEN).

The thickness Tf of the flexible film 164 may be 30 μm to 80 μm. Preferably, the thickness of the flexible film 164 may be 50 μm.

When the thickness Tf of the flexible film 164 is less than 30 μm, the flatness may be deteriorated during the process of forming the first hard coating layer 161 and the second hard coating layer 162. In addition, in a high temperature and high humidity environment, there may be a difference in deformation amount between the flexible film 164 and the first hard coating layer 161 or the second hard coating layer 162, and thus the cover window structure 160 may be curled. If the thickness Tf of the flexible film 164 is more than 80 μm, in a high temperature and high humidity environment, there may be a difference in deformation amount between the flexible film 164 and the first hard coating layer 161 or the second hard coating layer 162, and thus the cover window structure 160 may be curled. That is to say, the ratio among the thicknesses of the flexible film 164, the first hard coating layer 161 and the second hard coating layer 162 may be determined so that the deformation amount of the cover window structure 160 is reduced.

The cover window structure 160 is configured to include the first hard coating layer 161, the second hard coating layer 162 and the flexible film 164, and the thickness of the cover window structure 160 may be 150 μm to 240 μm. The thickness of the cover window structure 160 may be equal to the sum of the first thickness Tc1 of the first hard coating layer 161, the second thickness Tc2 of the second hard coating layer 162 and the thickness Tf of the flexible film 164.

If the thickness of the cover window structure 160 is less than 150 μm, the dent recovery ability may be deteriorated. If the thickness of the cover window structure 160 is more than 240 μm, the threshold curvature radius of 4 mm (4R) may not be achieved.

That is to say, the cover window structure 160 according to an exemplary embodiment of the present disclosure can provide excellent flexibility, surface hardness and dent recovery ability by adjusting the thicknesses of the first hard coating layer 161, the second hard coating layer 162 and the flexible film 164.

The adhesive member 150 is configured to fix the cover window structure 160 to the flexible display panel 110. The adhesive member 150 may be made of, but is not limited to, an optical clear adhesive (OCA), a pressure sensitive adhesive (PSA), etc. For example, when the adhesive member 150 is made of the OCA, the adhesive force may be controlled by adding an additive to the OCA. For example, an additive that cause heat, UV, light, chemical reactions, etc., may be mixed in the adhesive member 150. It is, however, to be understood that the present disclosure is not limited thereto.

The modulus of elasticity (which may also be referred to herein as a "modulus") of the adhesive member 150 may be $10^3$ Pa to $10^6$ Pa at wide temperature range. Preferably, the modulus of the adhesive member 150 may be $10^4$ Pa to $10^5$ Pa at wide temperature range. The wide temperature range refers to a low-temperature, a room-temperature and a high-temperature.

According to the above-described configuration, there is an effect that the reliability can be improved by the modulus characteristics of the adhesive member 150. In addition, there is an effect that the flexibility of the flexible display device 100 can be improved.

In some exemplary embodiments, an additional layer of an anti-reflection layer and/or an anti-static layer may be further formed on the first hard coating layer 161.

In some exemplary embodiments, a polarizing layer may be disposed under the cover window structure 160. The polarizing layer can reduce reflection of external light. Accordingly, outdoor visibility of the flexible display device 100 can be improved.

In some exemplary embodiments, a touch panel may be further disposed on the flexible display panel 110. The touch panel is an element that detects a user's touch input such as a touch or gesture on the screen of the flexible display device 100, and may be driven by capacitive sensing or the like.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A foldable display device, comprising:
   a foldable display panel; and
   a cover window structure on the foldable display panel, the cover window structure including a flexible film and a first hard coating layer disposed directly on the flexible film,
   wherein the first hard coating layer of the cover window structure is comprised of a single layer including only siloxane resin as a base material and at least one linker selected from an urethane-acrylic functional group, an acrylic functional group, and an epoxy functional group, and
   wherein the cover window structure further includes a black layer corresponding to a non-display area.

2. The foldable display device of claim 1, wherein a thickness of the first hard coating layer is equal to, or greater than, a thickness of the flexible film.

3. The foldable display device of claim 1, wherein a thickness of the flexible film is 30 μm to 80 μm.

4. The foldable display device of claim 1, further comprising:
   an adhesive member between the cover window structure and the foldable display panel, wherein a modulus of elasticity of the adhesive member is between and including $1\times10^3$ Pa to $1\times10^6$ Pa.

5. The flexible display device of claim 1, wherein the flexible film includes at least one of transparent polyimide, tri acetate cellulose (TAC), acryl, polyethylene terephthalate (PET), polycarbonate (PC), and polyethylene naphthalate (PEN).

6. The flexible display device of claim 1, wherein the foldable display panel includes a light-emitting element, and the light-emitting element includes an emission layer comprising a single emissive layer or a stack of multiple layers that emit light of different colors.

7. The flexible display device of claim 6, wherein the emission layer further includes at least one layer selected from a hole injecting layer, a hole transporting layer, an electron transporting layer, and an electron injecting layer.

8. A foldable display device, comprising:
a foldable display panel; and
a cover window on the foldable display panel, the cover window being a sequential layer stack including:
a flexible film;
a first hard coating layer disposed directly on a front surface of the flexible film, wherein the first hard coating layer is a single layer and includes only siloxane resin as a base material and at least one linker selected from an urethane-acrylic functional group, an acrylic functional group, and an epoxy functional group;
a second hard coating layer disposed on a rear surface of the flexible film, wherein the second hard coating layer is a single layer; and
a black layer corresponding to a non-display area.

9. The foldable display device of claim 8, wherein the second hard coating layer includes a same material as the first hard coating layer.

10. The foldable display device of claim 8, wherein the second hard coating layer is includes a different material than the first hard coating layer.

11. The foldable display device of claim 8, wherein a thickness of the first hard coating layer is equal to a thickness of the second hard coating layer.

12. The foldable display device of claim 8, wherein a thickness of the first hard coating layer is different from a thickness of the second hard coating layer.

13. A flexible display device, comprising:
a flexible display panel; and
a cover window structure on the flexible display panel, the cover window structure including a flexible film and a first hard coating layer disposed directly on the flexible film,
wherein the flexible film includes at least one of transparent polyimide, tri acetate cellulose (TAC), acryl, polyethylene terephthalate (PET), polycarbonate (PC), and polyethylene naphthalate (PEN),
wherein the first hard coating layer includes only siloxane resin as a base material and at least one linker selected from an urethane-acrylic functional group, an acrylic functional group, and an epoxy functional group, and
wherein the cover window structure further includes a black layer corresponding to a non-display area.

14. The flexible display device of claim 13, wherein a thickness of the first hard coating layer is equal to, or greater than, a thickness of the flexible film.

15. The flexible display device of claim 13, wherein a thickness of the flexible film is 30 μm to 80 μm.

16. The flexible display device of claim 13, wherein the cover window structure further includes a second hard coating layer disposed on a back side of the flexible film such that the first hard coating layer, the flexible film, and the second hard coating layer form a sequential layer stack.

17. The flexible display device of claim 16, wherein the second hard coating layer is a single layer and includes a same material as the first hard coating layer.

18. The flexible display device of claim 16, wherein the second hard coating layer is a single layer and includes a different material than the first hard coating layer.

19. The flexible display device of claim 16, wherein a thickness of the first hard coating layer is equal to a thickness of the second hard coating layer.

20. The flexible display device of claim 16, wherein a thickness of the first hard coating layer is different from a thickness of the second hard coating layer.

21. The flexible display device of claim 13, further comprising:
an adhesive member between the cover window structure and the flexible display panel, wherein a modulus of elasticity of the adhesive member is between and including $1\times10^3$ Pa to $1\times10^6$ Pa.

* * * * *